United States Patent [19]
Duggan et al.

[11] Patent Number: 5,747,827
[45] Date of Patent: May 5, 1998

[54] OPTOELECTRONIC SEMICONDUCTOR DEVICE HAVING A MINIBAND

[75] Inventors: Geoffrey Duggan, Oxfordshire, United Kingdom; Nobuaki Teraguchi, Nara-ken, Japan; Judy Megan Rorison, Cheltenham, United Kingdom; Yoshitaka Tomomura, Nara, Japan

[73] Assignee: Sharp Kabushiki Kaisha, Osaka, Japan

[21] Appl. No.: 612,294

[22] Filed: Mar. 7, 1996

[30] Foreign Application Priority Data

Mar. 8, 1995 [GB] United Kingdom .................. 9504666

[51] Int. Cl.$^6$ .................. H01L 29/06; H01L 31/0328; H01L 31/0336; H01L 31/072
[52] U.S. Cl. .................. 257/15; 257/9; 257/12; 257/14
[58] Field of Search .................. 257/13, 14, 15, 257/17, 18, 22, 23; 372/44, 45

[56] References Cited

U.S. PATENT DOCUMENTS

| | | | |
|---|---|---|---|
| 4,620,206 | 10/1986 | Ohta et al. | 357/4 |
| 4,862,471 | 8/1989 | Pankove | 372/45 |
| 4,866,488 | 9/1989 | Frensley | 357/4 |
| 5,027,164 | 6/1991 | Awano | 357/4 |
| 5,040,186 | 8/1991 | Logan et al. | 372/45 |
| 5,324,959 | 6/1994 | Nakamura et al. | 257/17 |

FOREIGN PATENT DOCUMENTS

| | | |
|---|---|---|
| 0334759 | 9/1989 | European Pat. Off. . |
| 0556461 | 8/1993 | European Pat. Off. . |
| 0614253 | 9/1994 | European Pat. Off. . |
| 632554 | 1/1995 | European Pat. Off. . |
| 575217 | 3/1993 | Japan . |
| 9208250 | 5/1992 | WIPO . |
| 9400884 | 1/1994 | WIPO . |

OTHER PUBLICATIONS

European Search Report for Application EP 96301594.6, mail Nov. 29, 1996.
Ikuo Suemune, J. Appl. Phys. 67(5), 1 Mar. 1990, "Doping in a Superlattice Structure: Improved Hole Activation in wide-gap II–VI Materials", pp. 2364–2370.
H. Okuyama et al., Electronics Letters, 10th Sep. 1992, vol. 28, No. 19, "ZnSe/ZnMgSSe Blue Laser Diode", pp. 1798–1799.
Suemune, J. Appl. Phys. 67(5), 1 Mar. 1990, American Inst. of Physics, pp. 2364–2369, "Doping in a Superlattice . . . ".
Okuyama et al, Journal of Crystal Growth 117(1992) 139–143, "Epitaxial Growth of ZnMgSSe on GaAs Substrate by . . . ".
Okuyama et al, Appl. Phys. Lett. 64(7), 14 Feb. 1994, pp. 904–906, "Epitaxial Growth of p–Type ZnMgSSe".
Fan et al, Appl. Phys. Lett. 61(26), 28 Dec. 1992, pp. 3160–3162, "Graded Band Gap Ohmic Contact to p–ZnSe".
Hiei et al, Electronics Letters, 13 May 1993, vol. 29, No. 10, pp. 878–879, "Ohmic Contacts to P–Type ZnSe Using . . . ".
Ishibashi et al. 7th Ann. Mtg., IEEE, "One Hour Long Room Temp. CW Operation ZnMgSSe Based Blue–Green . . . ".
Haase et al, Appl. Phys. Lett. 59(11) 9 Sep. 1991, pp. 1272–1274, "Blue–Green Laser Diodes".

(List continued on next page.)

*Primary Examiner*—Sara W. Crane
*Assistant Examiner*—Douglas A. Wille

[57] ABSTRACT

An optoelectronic semiconductor device is provided in which carrier transport towards the active region thereof is enhanced by the formation of a miniband within a superlattice region of the device having a repeating pattern of first and second semiconductor regions. The minimum energy level of the miniband is equal to or greater than the energy level of a guiding region between the active region and the superlattice region.

33 Claims, 13 Drawing Sheets

OTHER PUBLICATIONS

Itoh et al, Elec. Letters, 29 Apr. 1993, vol. 29, No. 9, pp. 766–768, "Room Temp. Pulsed Operation of 498nm Laser . . . ".

Nakayama et al, Elec. Lett., 9 Dec. 1993, vol. 29, No. 25, pp. 2194–2195, "Continuous Wave Operation of 489.9 nm Blue . . . ".

Nakayama et al, Elec. Lett. 5 Aug. 1993, vol. 29, No. 16, pp. 1488–1489, "Room Temp. Continuous Operation of Blue . . . ".

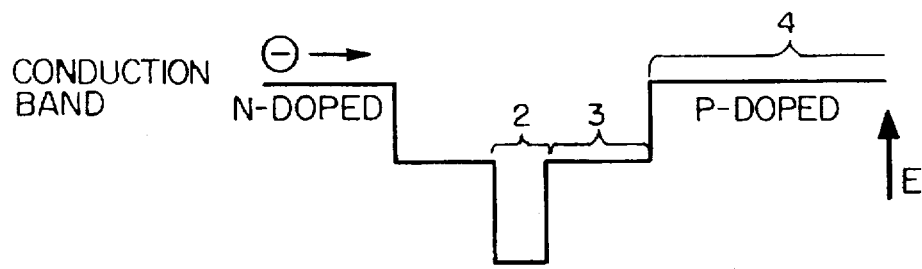
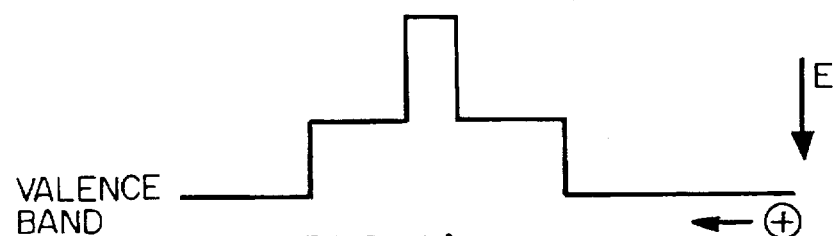
FIG. 1
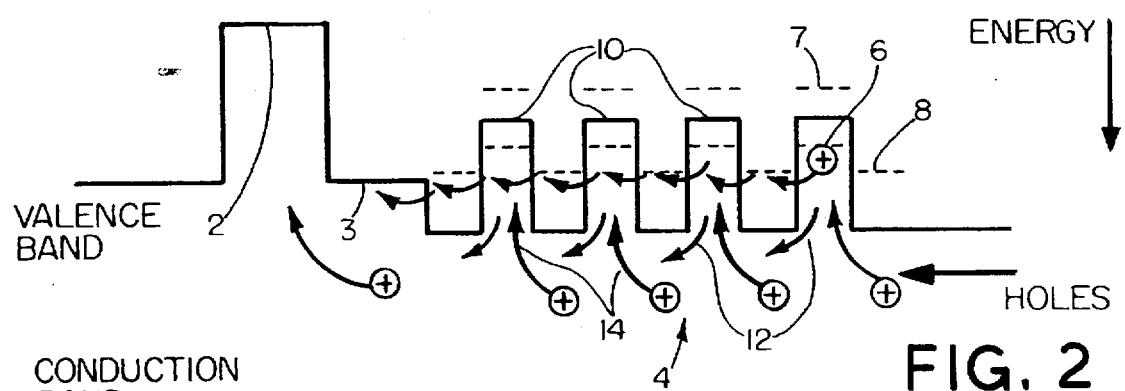
FIG. 2
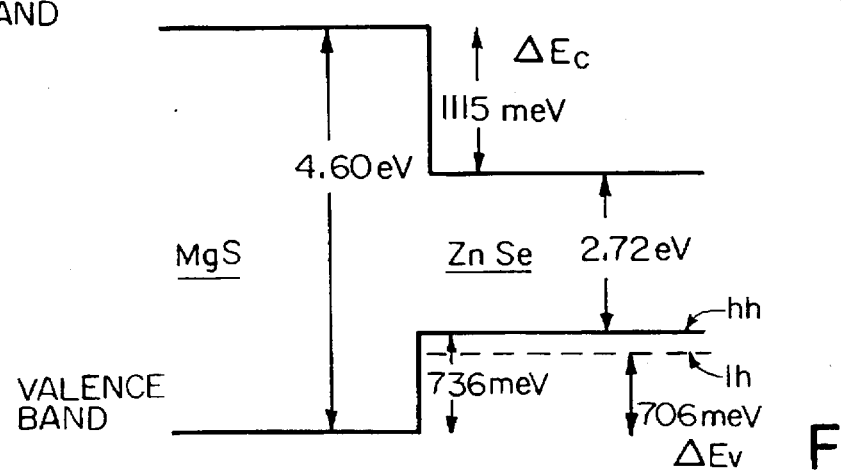
FIG. 3

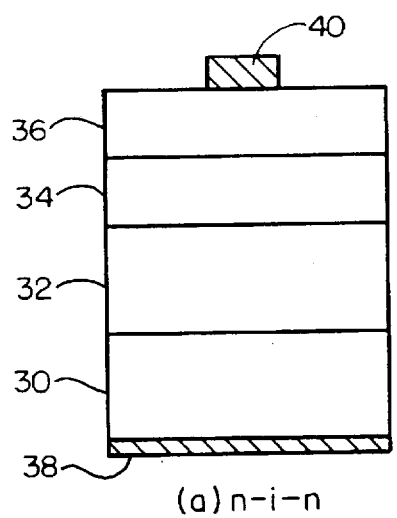 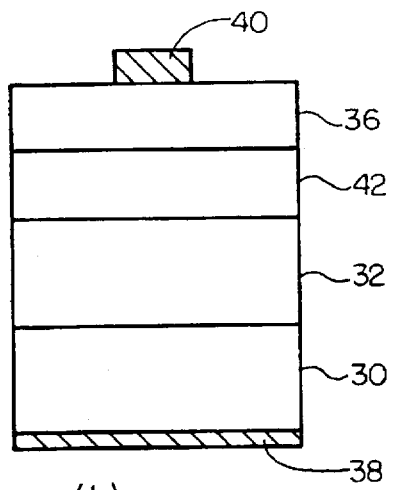
FIG. 14  (a) n-i-n
FIG. 15  (b) n-n-n
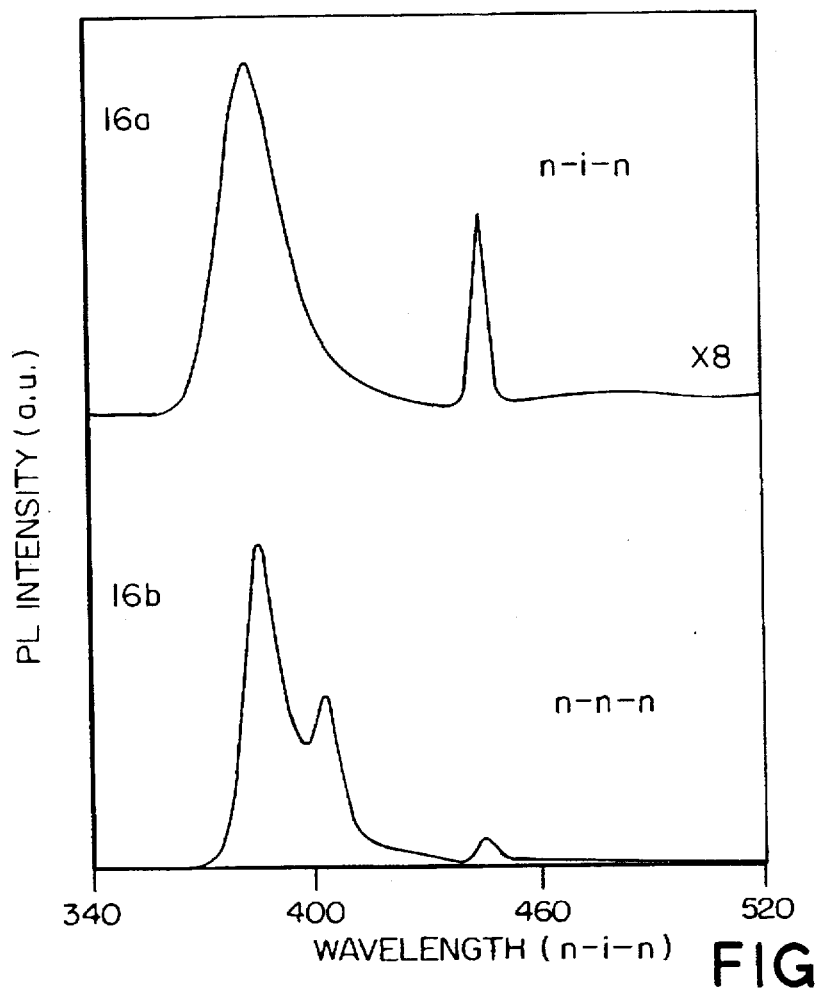
FIG. 16

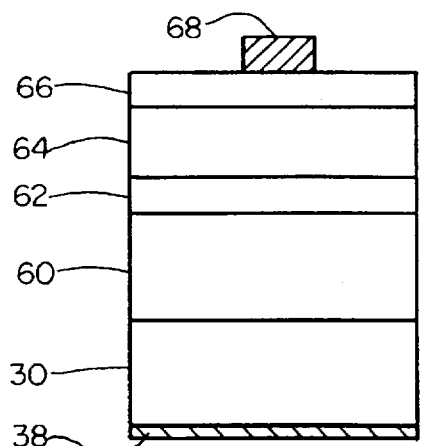
FIG. 22
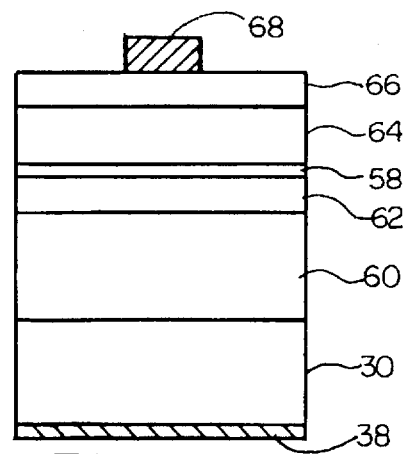
FIG. 23
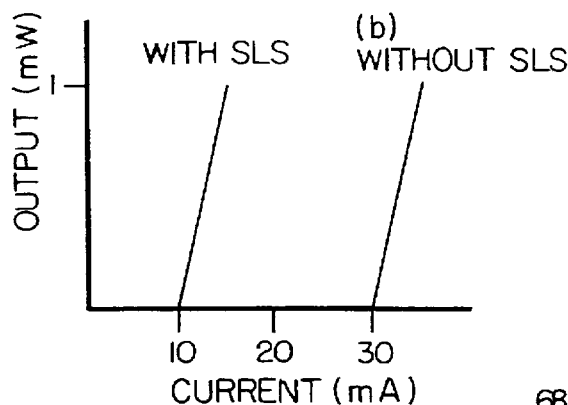
FIG. 24
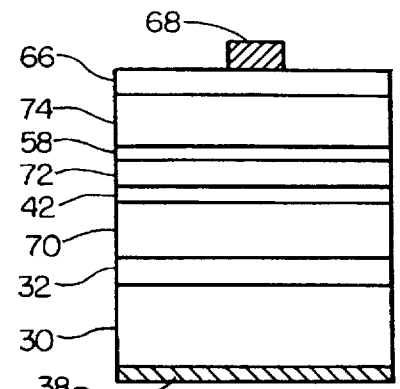
FIG. 25
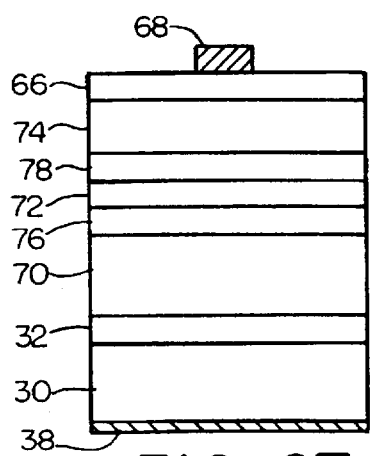
FIG. 27
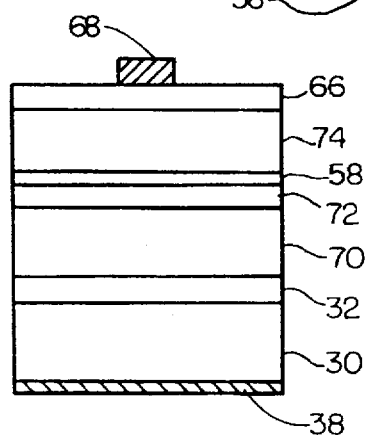
FIG. 26
FIG. 28  GRIN-SCH

OPTOELECTRONIC SEMICONDUCTOR DEVICE HAVING A MINIBAND

The present invention relates to an optoelectronic semiconductor device having a miniband. Such a miniband improves the transportation of charges within the device. In particular, the miniband improves the operation of semiconductor light sources, modulators and detectors operating in the green or blue region of the electromagnetic spectrum.

Researchers in the field of optoelectronic semiconductor devices have been investigating ways to provide light sources operating in the blue-green optical region. The properties of II–VI compound semiconductors as guiding region and cladding region materials have been reported.

Initial research on blue-green optical devices reported the use of ZnSe and $ZnS_{0.07}Se_{0.93}$ as guiding and cladding region materials, respectively ("Blue-green laser diodes", M. A. Haase et al., Appl. Phys Lett. 59 p. 1272). Some researchers reported that a $ZnS_{0.07}Se_{0.93}$ guiding region and a ZnMgSSe cladding region lattice matched to GaAs were necessary for the reduction of threshold and shortening the lasing wavelength ("Room temperature continuous operation of blue-green laser diode", N. Nakayama et al., Electron Lett. 29 P. 1488).

However, the rapid decrease of net acceptor concentration (Na—Nd) with increasing bandgap energy in ZnMgSSe, which was believed to be a good material for the reduction of threshold current and shortening the lasing wavelength, may define limits of the threshold current and the lasing wavelength. The shortest lasing wavelength that the applicants are aware of is 489.9 nm and the threshold current density is 1.5 $kA/cm^3$ for continuous operation at room temperature. ("Continuous-wave operation of 489.9 nm blue laser diode at room temperature", N. Nakayama et al., Electron Lett. 29 p. 2194).

In order to avoid the drastic of net acceptor concentration (Na—Nd) and to improve doping efficiency, the use of a modulation doping technique has been proposed ("Doping in a superlattice structure: improved hole activation in wide-gap II–VI materials", I. Suemune, J. Appl. Phys. 67 p. 2364). Furthermore, another technique of introducing a superlattice structure has also been proposed ("One-hour-long room temperature CW operation of ZnMgSSe-based blue-green laser diodes", A. Ishibashi et al., 7th annual meeting on the IEEE Lasers and Electro-Optics Society (1994)).

Researchers have found it difficult to obtain blue colour laser diodes with the wavelength shorter than 480 nm continuous wave operation at room temperature even when using a ZnMgSSe cladding layer lattice matched to GaAs.

FIG. 1 shows the energy level diagram of a conventional separate confinement heterostructure (SCH) laser diode (LD) having an undoped active region 2 in which the carriers, electrons and holes, recombine to emit light of a wavelength determined by the conductive-valence bandgap energy. The active region 2 may be a single quantum well (SQW) or it may be a multi-quantum well (MQW) structure with barriers separating the wells. Guiding regions 3 and doped cladding regions 4 act as confinement barriers for the carriers contained in the active region 2. The guiding regions 3 have a higher refractive index than the cladding regions and serve to guide the optical waves. In conventional LEDs, the guiding regions are omitted.

To shorten the lasing wavelength, it is necessary to increase the bandgap energy of active region 2. It is therefore necessary to increase the bandgap energy of the confinement barriers defined by the regions 3 and 4, otherwise the band discontinuity between the active region and the regions 3 and 4 will be reduced and will result in the increase of carrier overflow and consequential increase of threshold current.

ZnMgSSe quaternary is thought to be a promising material for both reducing the threshold current and shortening the lasing wavelength. However, as mentioned above, a rapid decrease of net acceptor concentration (Na—Nd) with increasing bandgap energy in ZnMgSSe has been reported. This means that it is difficult to obtain ZnMgSSe films with a good conductivity and relatively large bandgap energy. ZnMgSSe with a relatively large bandgap energy contains relatively large amounts of S and Mg, which may result in the poor zinc blende crystal quality as the chemical composition approaches MgS because the stable crystal structure for MgS is a rocksalt structure.

To compensate for the rapid decrease of net acceptor concentration and to improve the doping efficiency, the use of modulation doping technique has been proposed by Suemune (supra). However, in his proposal, the carrier transport takes place by a mechanism known as hopping, as shown in FIG. 2.

The modulation doping is intended to increase the number of free holes in the valence band of the quantum wells 10 of a ZnSe/ZnSSe multiple quantum well system. In such a II–VI system, the activation energy Ea of the acceptors is very large, ranging from 110–150 meV. Consequently the population of thermally activated free holes is very small. The population of free holes in the p type ZnSe is of crucial importance since the resistivity r of the material is given by $$r = \frac{1}{q\mu p}$$

where q=electron charge
$\mu$=hole mobility (=30 $cm^2/Vs$)
p=hole concentration Therefore, in order to realise a low-resistivity and hence reduce power dissipation within the device, an increase in the hole concentration is desirable. Suemune calculate that the free hole concentration could be increase by about 4 to 5 times for a doped superlattice having a period of 60 Å. However, while the holes are free to move parallel to the quantum wells 10, transport perpendicular to the quantum wells is not so good as the holes have to hop across the quantum wells. Unfortunately, it is the transport of holes perpendicular to the direction of the quantum wells which is important in the operation of many optoelectronic devices such as LEDs, lasers, detectors and modulators. There is a real possibility that the modulation doping described by Suemune could degrade the transport process along the direction perpendicular to the quantum wells since the quantum wells can act as traps for carriers (holes) which relax into them, as shown in FIG. 2. The thermal activation of holes out of the quantum wells is represented by the arrows 12 and the relaxation of holes into the quantum wells is represented by the arrows 14. The relative sizes of the arrows schematically illustrate the probability of each event with increasing probability represented by bigger arrows. FIG. 2 also indicates the energy level 6 of the first confined quantum state within each well and the energy levels 7 and 8 of the dopant materials (acceptors) within the well and barrier materials, respectively.

EP-A-0334759 discloses a unipolar semiconductor laser having a GaAs/AlGaAs system in which the lasing structure involves inter-sub-band transitions between minibands in the conduction band of a semiconductor. In such device, electrons are injected into an upper sub-band and traverse through a barrier or cladding region into the active region which is part of the upper miniband. The electron density in the active region increases as a result of the miniband increasing in energy in the barrier region, and the electrons then undergo a radiative transition into a lower miniband, thereby emitting light. The carriers exhibit coherent miniband transport through the barrier and active regions. This device is for the generation of long wavelength light and is not suitable for the generation of short wavelength (green or blue) light.

EP-A-0614253 discloses a distributed feedback (DFB) in GaAsP-type laser device having an MQW laser diode section and an optical modulation section which is integrated with the laser diode section and which contains a multi-quantum well structure. The multi-quantum well structure of the optical modulator section is a coupled multi-quantum well structure in which quantum states of the quantum wells are coupled with one another to form minibands. However, such minibands are not involved in the transport of carriers to the active region of the laser diode section.

WO 92/08250 and 94/00884 disclose MQW photodetectors wherein the quantum wells of the photodetector active region are separated by superlattice barrier layers having minibands.

According to a first aspect of the present invention, there is provided an optoelectronic semiconductor device including an active region, a first superlattice region and a guiding region disposed between the active region and the superlattice region, the first superlattice region having a repeating pattern of first and second semiconductor regions which define a plurality of quantum wells separated from each other by quantum barriers, the pattern repeat period being sufficiently small so as to form a miniband within the first superlattice region, wherein the minimum energy level of the miniband is greater than or equal to the, or the minimum, energy level of the guiding region.

According to a second aspect of the present invention, there is provided an optoelectronic semiconductor device including an active region and an adjacent first superlattice region, the first superlattice region having a repeating pattern of first and second semiconductor regions which define a plurality of quantum wells separated from each other by quantum barriers, the pattern repeat period being sufficiently small so as to form a miniband within the first superlattice region, wherein the first superlattice region defines a carrier confinement barrier for the active region, and wherein the minimum energy level of the miniband is equal to the energy level of the barrier.

According to a third aspect of the present invention, there is provided an optoelectronic semiconductor device including (a) an active region comprising a first plurality of quantum wells separated from each other by first quantum barriers, and (b) a first superlattice region, the first superlattice region having a repeating pattern of first and second semiconductor regions which define a second plurality of quantum wells separated from each other by second quantum barriers, the pattern repeat period being sufficiently small so as to form a miniband within the first superlattice region, wherein the minimum energy level of the miniband is greater than or equal to the level of the first quantum barriers.

The term "miniband" as used herein describes an electronic miniband which is a band of states which allow charge carriers, preferably holes, to move easily.

The present invention is particularly applicable to devices of the type wherein the active region has an energy bandgap corresponding to the energy bandgap between the conduction and valence bands of the material forming the active region.

By forming a series of closely spaced quantum wells in the first superlattice region, the quantum wave functions which extend outside of each well overlap with the wave functions of neighbouring wells. The overlapping wave functions form a miniband thereby improving carrier transport perpendicular to the quantum wells. The alternating series of first and second semiconductor regions forms the superlattice.

The enhanced carrier transport through the valence band within the first superlattice region can only be achieved if the carriers can be injected into the miniband. The carriers then travel through the miniband where they may lose some energy. The main influence on whether the carriers can be transported through the miniband is the energy of the miniband relative to the energy of an injection disposed on the opposite side of the first superlattice region to the active region and the energy of the guiding region or barrier between the first superlattice region and the active region. The minimum energy of the miniband within the superlattice must be greater than or equal to the potential energy level of a guiding region or barrier positioned between the superlattice and an active region of the device. Similarly the energy level of the injection region should be near or overlapping that of the miniband. If the energy of the injection region is substantially lower (eg more than 100 meV lower) than the minimum energy level of the miniband, then the flow of carriers into the first superlattice region tends to be obstructed.

Preferably at least the semiconductor layers forming the quantum barriers of the first superlattice region are doped. This further increases the population of carriers and enhances conductivity within the first superlattice region. The quantum well regions of the first superlattice region may also be doped.

Preferably, the width of the miniband is chosen to substantially maximise the transport of carriers. Preferably, the carriers are holes. The width of the miniband depends upon the semiconductor materials as well as the widths of the barrier and well layers, i.e. the widths of the first and second semiconductor regions. Furthermore, the width of the miniband is chosen such that carrier transport via the miniband is still possible when an electric field is placed across the first region, i.e. the miniband does not separate into Stark levels.

Preferably the semiconductors are chosen from the pseudomorphic quaternary alloys, such as the compounds of Zn, Mg, S and Se. Advantageously the first and second regions form a superlattice having a $ZnS_xSe_{1-x}$—$MgS_ySe_{1-y}$ ($0 \leq x, y \leq 1$) structure.

Advantageously, the widths of either of the first and second semiconductor regions or the repeat period of the pattern may be altered so as to vary the bandgap. The bandgap may be varied in a substantially parabolic manner. A second superlattice region may be provided on an opposite side of the active region to the first superlattice region. Each such superlattice region may have a spatially varying repeat period and may cooperate to define a graded index separate confinement heterostructure device. Such a structure is optically efficient.

Preferably the first and second semiconductor regions are substantially lattice matched with the lattice of a substrate such that little or no stress is exerted on the first and second semiconductor layers. The substrate may be GaAs and the lattice constants of the first and second semiconductor layers may be varied by changing the concentration of Mg and/or S within the layers.

Preferably the device is a LED, a laser, a modulator or a detector.

As an alternative, the first and second semiconductor regions may be formed of III–V semiconductor systems, such as (AlGaIn)P and (AlGaIn)N alloys.

The period of repeat is preferably 6 monolayers or less. In the case of a material having a zinc blende crystal structure, the width of a monolayer is half the lattice constant.

It is thus possible to improve carrier transport towards the active region of a device. Furthermore, the superlattice region(s) can also define a graded index region to improve confinement within the active region.

The present invention will further be described, by way of example, with reference to the accompanying drawings, in which:

FIG. 1 schematically illustrates an energy level diagram for a conventional separate confinement heterostructure laser diode;

FIG. 2 schematically illustrates an energy level diagram in a modulation doping scheme as disclosed by Suemune (supra);

FIG. 3 is a schematic illustration of the bandgaps for adjacent layers of MgS and ZnSe;

FIGS. 14 and 15 show device incorporating superlattices for investigation of the effect of such superlattices;

FIGS. 16a and 16b show PL spectra for the devices illustrated in FIGS. 14 and 15;

FIG. 22 illustrates a laser not constituting an embodiment of the present invention;

FIG. 23 illustrates a laser similar to that shown in FIG. 22, but constituting an embodiment of the present invention;

FIG. 24 is a graph comparing output light intensity versus current for the devices shown in FIGS. 22 and 23;

FIGS. 25 to 27 illustrates further embodiments of the present invention;

FIG. 28 is an energy level diagram for the device shown in FIG. 27;

Figure 4:
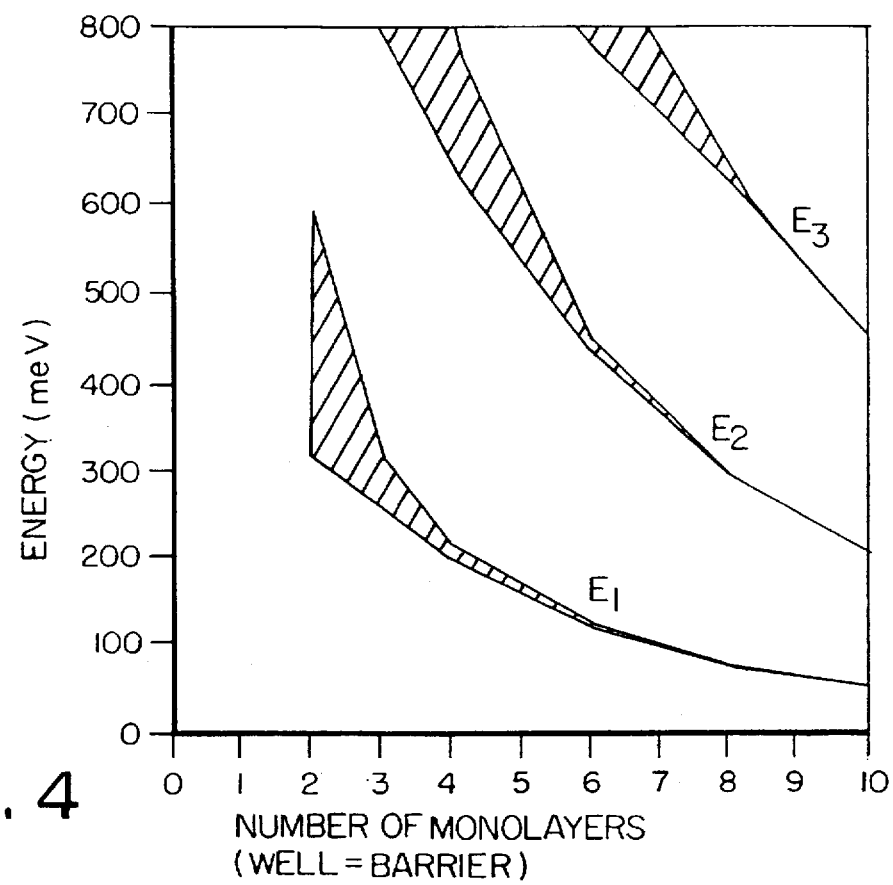
FIG. 4 is a schematic illustration of the energy levels for holes within a quantum well, and the broadening of the levels to form minibands.

As mentioned above, it is necessary to increase the bandgap energy of the confinement barriers defined by the guiding region/barrier and the cladding region of a semiconductor laser to reduce the threshold current and to shorten the lasing wavelength. The proportions of S and MG in ZnMgSSe can be varied to increase the bandgap thereof, but may require so much S and Mg that the structure begins to resemble MgS. This results in a poor crystal quality because the stable crystal structure for MgS is the rocksalt structure. Therefore, from the view point of crystal quality, there is an upper limit of S and Mg compositions for ZnMgSSe. However, this limit can be breached using a superlattice structure and growing MgS films with a zinc blende structure, and not a rocksalt structure. If the film thickness of $MgS_ySe_{1-y}$ ($0 \leq y \leq 1$) is sufficiently thin, zinc blende $MgS_ySe_{1-y}$, can be grown on $ZnS_xSe_{1-x}$ ($0 \leq x \leq 1$) and an upper $ZnS_xSe_{1-x}$ layer grown over the $MgS_ySe_{1-y}$ layer will stabilize the zinc blende structure of the $MgS_ySe_{1-y}$ layer. The layers can be repeated to define a superlattice in which the discontinuities between the layers give a theroretical maximum band discontinuity, $\Delta Ec$ (condition band energy change) of 0 to 1115 meV and $\Delta Ev$ (valance band energy change) of 0 to 736 meV as shown in FIG. 3. FIG. 3 shows two energy levels at the valence band, these levels relate to light holes (lh) and heavy holes (hh). the energy levels for the holes in an unstressed material are degenerate, however stress within the material lifts the degeneracy. The heavy holes have a lower energy level and consequently are more populated.

Within a structure comprising first and second alternating semiconductor layers, a miniband is formed as the layer thickness becomes reduced. The formation of the miniband can be considered as the superposition of a multiplicity of solutions of the "square well" otherwise known as "particle in a box" quantum mechanical problem. To recap, the "square well" problem involves solving the Schrodinger equation, $$\frac{-\hbar^2}{2m} \frac{d^2\psi}{dZ^2} = E\psi$$

for an infinitely deep well of width $L_z$ (extending from 0 to $L_z$). In this solution, boundary conditions are that the wave function falls to zero at the edges of the well. Thus the solution is $$En = \frac{\hbar^2}{2m} \left( \frac{n\pi}{L_Z} \right)^2$$

where:

m is effective mass of the particle $\eta$=Planck's constant/$2\pi$
$\Psi$=quantum wavefunction
and $$\psi_n = A \sin \frac{n\pi Z}{L_z}$$

where Z is position within the box.

However, when the height of the well becomes finite the wave functions can take non-zero values outside the confines of the well. Furthermore the solution contains both even (symmetric) solutions and odd (anti-symmetric) solutions.

The solutions to the finite well equations for a well extending from $-L/2$ to $+L/2$ give even solutions that approximate $$\cos \frac{n\pi Z}{L}$$

within the well and antisymmetric solutions which approximate $$\sin \frac{n\pi Z}{L}$$

within the well. Each solution also has an evanescent-wave which extends outside of the well.

The energy levels of the finite square well are similar to, but slightly lower than, the corresponding levels for the infinitely deep well solution.

FIG. 4 illustrates solutions to the Schrodinger equations for the first three energy levels (n=1 to 3) for holes within a finite well which is one of a series of wells formed by alternating layers of ZnSe and MgS. Thickness is measured in terms of monolayers of the crystal (one monolayer=2.82 Å). The well and barrier thickness are substantially identical. Starting with thicknesses of 10 monolayers, each well is effectively isolated from its neighboring wells as the value of the evanescent wave function from neighbouring wells is substantially zero. A reduction in the number of monolayers (i.e. reducing the width of the wells and barriers) causes the energy levels of the solutions to increase—as would be expected since En is inversely proportional to the width of the well. Once the width of the wells and barriers reduces still further, the evenscent wave functions (of which the symmetric and antisymmetric solutions have different values) of the other wells begin to have significant non-zero values within the well and this splits the energy level solution into a series of values. The result of forming a series of quantum wells is that the energy levels from a continuum within a band, as indicated by the hatched regions in FIG. 4.

Figure 5:
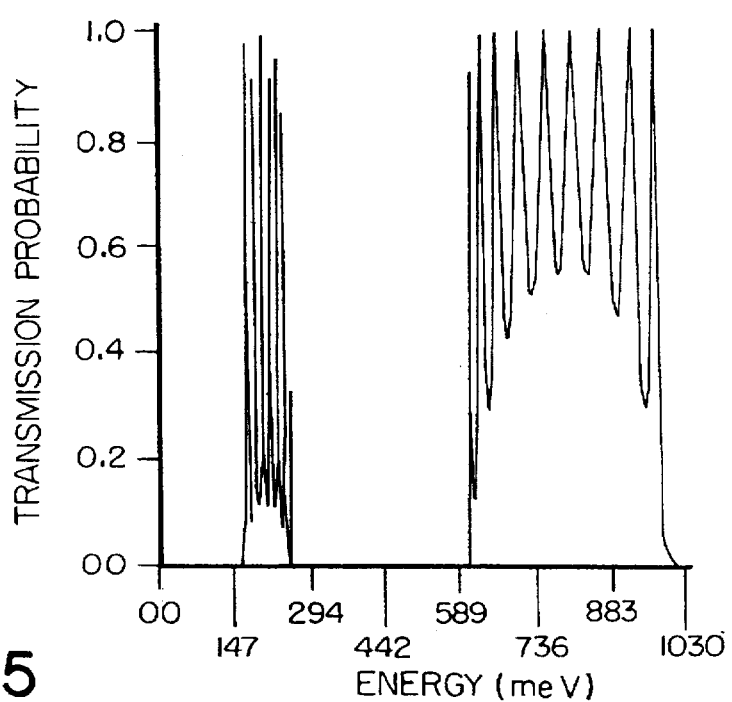
FIG. 5 is a plot of transmission probability versus energy level for a device constituting an embodiment of the present invention.

FIG 5 illustrates the transmission probability versus energy for a heavy hole within a strained layer superlattice which has ten periods of four monolayers of ZnSe and two monolayers of MgS. The transmission probability rises as high as 0.9.

As noted above, to obtain blue light generation, it is necessary to increase the bandgap energy of confinement barrier region. The region decrease of net acceptor concentration (Na—Nd) with increasing bandgap energy in ZnMgSSe makes it difficult to obtain ZnMgSSe films which have high conductivity and a large bandgap energy. Modulation doping can overcome these problems. However, in the present invention, the period of the superlattice is small enough to form a miniband, and carrier transport is carried out through the miniband (FIG. 6) which result in better carrier transport than hopping (FIG. 2). The period of the superlattice should be thin enough to form a miniband, e.g. less than 6 monolayers when $d_{ZnSe}=d_{MgS}$, where d represents thickness.

Figure 6:
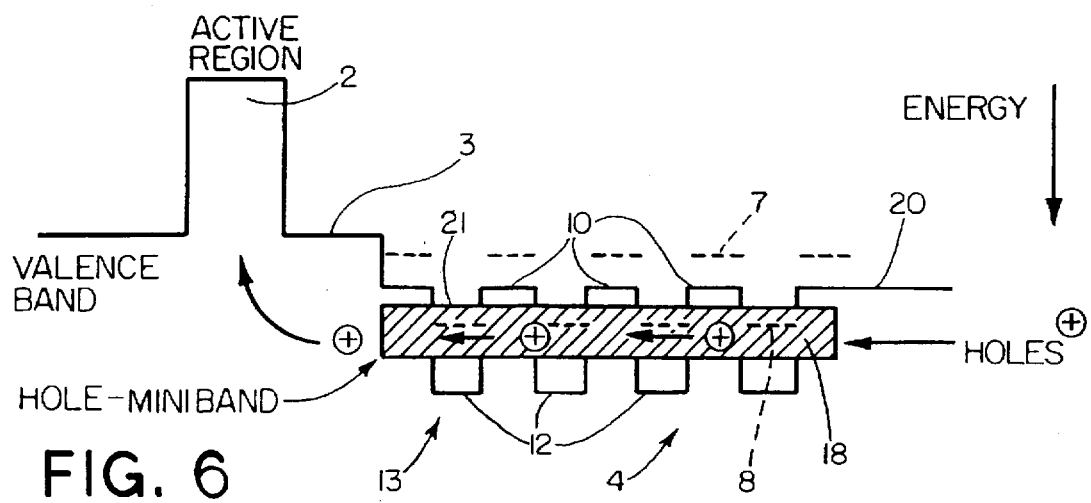
FIG. 6 is a schematic illustration of the carrier hole energy level versus displacement for a semiconductor device constituting a first embodiment of the present invention.

FIG. 6 schematically illustrates the energy level scheme within a semiconductor device constituting a first embodiment of the present invention. The level scheme is similar to that shown in FIG. 2 inasmuch as there is a plurality of quantum wells 10 defined by barriers 12. There are however two significant difference. The first is that the quantum wells 10 and barriers 12 are thinner (this feature is not illustrated) such that a superlattice region 13 with a miniband 18 are formed. The second is that the relevant energy criteria for the holes both for injection into the miniband 18 and for the emergence of holes from the miniband 18 into the active region 2 of the device are satisfied. The hole injection criterion is satisfied if the energy level of the miniband 18 overlaps or is sufficiently close to the energy level of an injection region 20 which, together with the superlattice region 13, define the cladding region 4 in this embodiment. The hole emergence criterion is satisfied if the minimum energy level 21 of the miniband 18 is greater than or comparable to the energy level of the valence band of guiding region 3 positioned between the superlattice region 13 and the active region 2 of the device. Holes are then able to pass via the miniband 18 from the injection region 20 into the active region 2.

The formation of such a miniband 18 which a minimum energy level greater than or equal to that of the region 3 and comparable with or less than that of the region 20 requires that the barriers 12 of the superlattice be composed of a semiconductor material having a larger bandgap that the active region 2 of the device. If the energy of the miniband 18 is slightly more than the energy of the injection region 20, holes can still be thermally promoted into the miniband.

Figure 7:
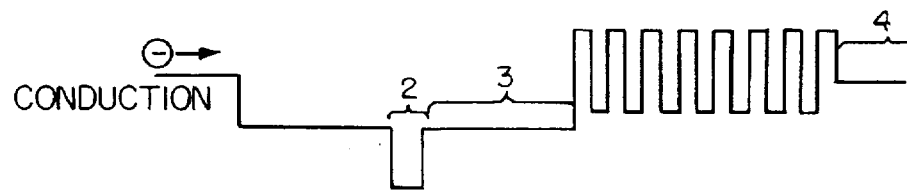
FIG. 7 is a schematic illustration of the carrier hole energy level versus displacement for a semiconductor device constituting a second embodiment of the present invention.

In the embodiment of FIG. 7, the superlattice region 13 with miniband 18 is incorporated between the guiding region 3 and the cladding region 4, the latter being formed in this embodiment by the injection region 20 which injects holes into the miniband 18. In an LED device, such guiding region 3 is omitted, and the superlattice region 13 itself defines the carrier confinement barrier for the active region 2. In such a case, the minimum energy level of the miniband 18 is equal to the energy level of the confinement barrier.

Figure 8:
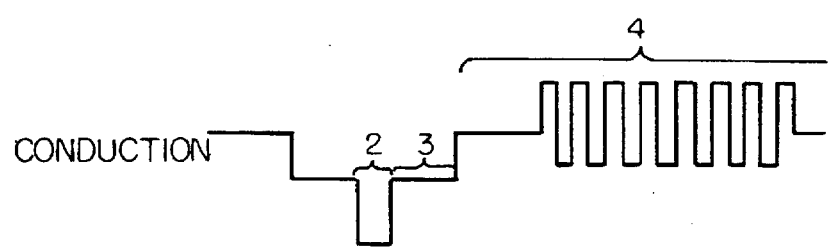
FIG. 8 is a schematic illustration of the carrier hole energy level versus displacement for a semiconductor device constituting a third embodiment of the present invention.

In the embodiment of FIG. 8, the superlattice region 13 with miniband 18 is formed within the cladding region 4. In an LED device, the guiding region 3 is omitted, and the cladding region 4 defines the carrier confinement barrier for the active region 2. In such a case, the minimum energy level of the miniband 18 is equal to the energy level of the confinement barrier.

Figure 9:
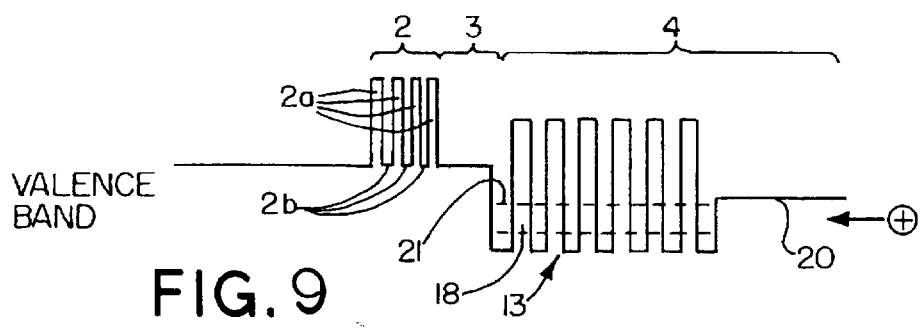
FIG. 9 is a schematic illustration of the carrier hole energy level versus displacement for a semiconductor device constituting a fourth embodiment of the present invention.

In the embodiment of FIG. 9, the device is similar to that of FIG. 7 in that the superlattice region 13 with miniband 18 is incorporated between the guiding region 3 and the cladding region 4. However, in this embodiment, the active region 2 is and MQW region defined by a multiplicity of active quantum wells 2a separated by barriers 2b. The criterion is that the minimum energy level 21 of the miniband 18 is greater than or equal to the energy level of the barriers 2b.

Figure 10:
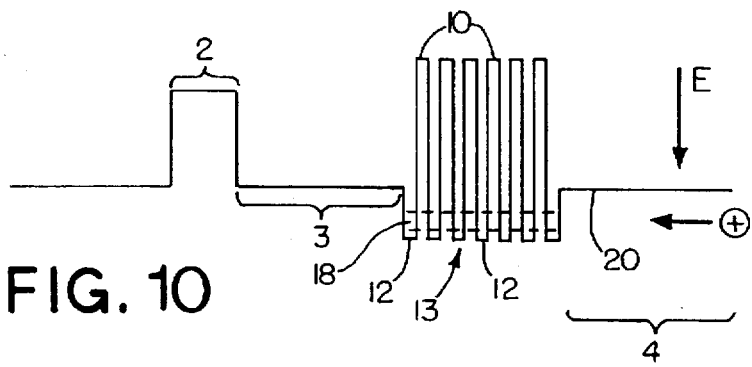
FIG. 10 is a schematic illustration of the carrier hole energy level versus displacement for a semiconductor device constituting a fifth embodiment of the present invention.

In the embodiment of FIG. 10, the device is similar to that of FIG. 7 in that the superlattice region 13 with miniband 18 is incorporated between the guiding region 3 and the cladding region 4. However, in this embodiment, the energy level of the bulk material defining the wells 10 of the superlattice region 13 is less than that of the active region 2.

Figure 11:
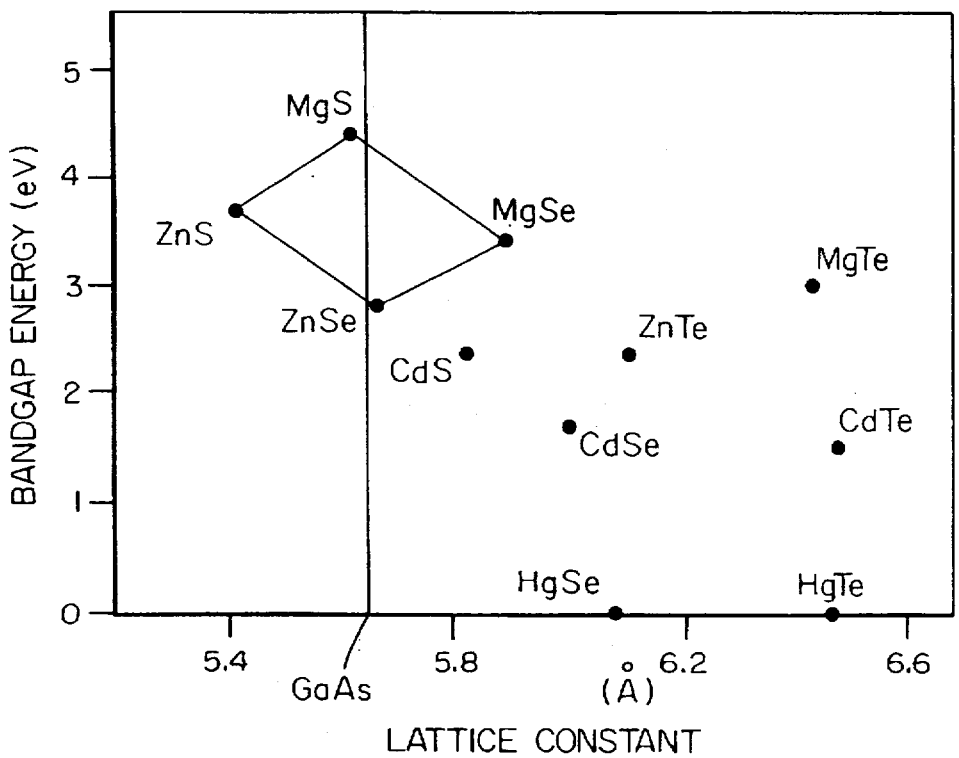
FIG. 11 is a plot showing bandgap and lattice constant for various semiconductors.

FIG. 11 shows the bandgap energy and the lattice constant for a plurality of II–VI compound semiconductors. The lattice constants of ZnSe and MgS are 5.6681 Å and 5.62 Å respectively, which are almost lattice matched to a GaAs substrate (5.653 Å). The lattice constant of ZnSe is slightly larger than that of GaAs and the lattice constant of MgS is slightly smaller than that of GaAs. Therefore, the inner stress of ZnSe—MgS superlattice can be made equal to zero by suitable choice of layer thickness. Stress cancellation is almost complete when $d_{ZnSe}=2d_{MgS}$. Furthermore, by selecting the proper compositions of x and y in $ZnS_xSe_{1-x}$—$MgS_ySe_{1-y}$ (0≤x, y≤1), the superlattice can be perfectly lattice matched to GaAs. Using a strain balanced composition, the inner stress of $ZnS_xSe_{1-x}$—$MgS_ySe_{1-y}$ (0≤x, y≤1) superlattice can be nearly equal to zero.

Within the range of compounds $ZnS_xSe_{1-x}$ and $MgS_ySe_{1-y}$, ZnSe (x=0) and MgS (y=1) are binary compounds, and consequently have the highest composition controllability. However, $ZnS_xSe_{1-x}$ and $MgS_ySe_{1-y}$, still have a greater composition controllability than ZnMgSSe quaternary compounds.

A series of experiments have been performed to investigator the properties of devices incorporating superlattices.

To begin with, the MgS barrier thickness dependence of PL spectra of ZnSe—MgS strained layer superlattice was investigated. The strained layer superlattices were grown by molecular beam epitaxy with following growth conditions: GaAs substrate temperature of 275° C., beam equivalent pressures of Zn, Se, Mg and S are $6\times10^{-7}$, $1.4\times10^{-6}$ $1.0\times10^{-7}$ and $2\times10^{-7}$ Torr, respectively.

Figure 12:
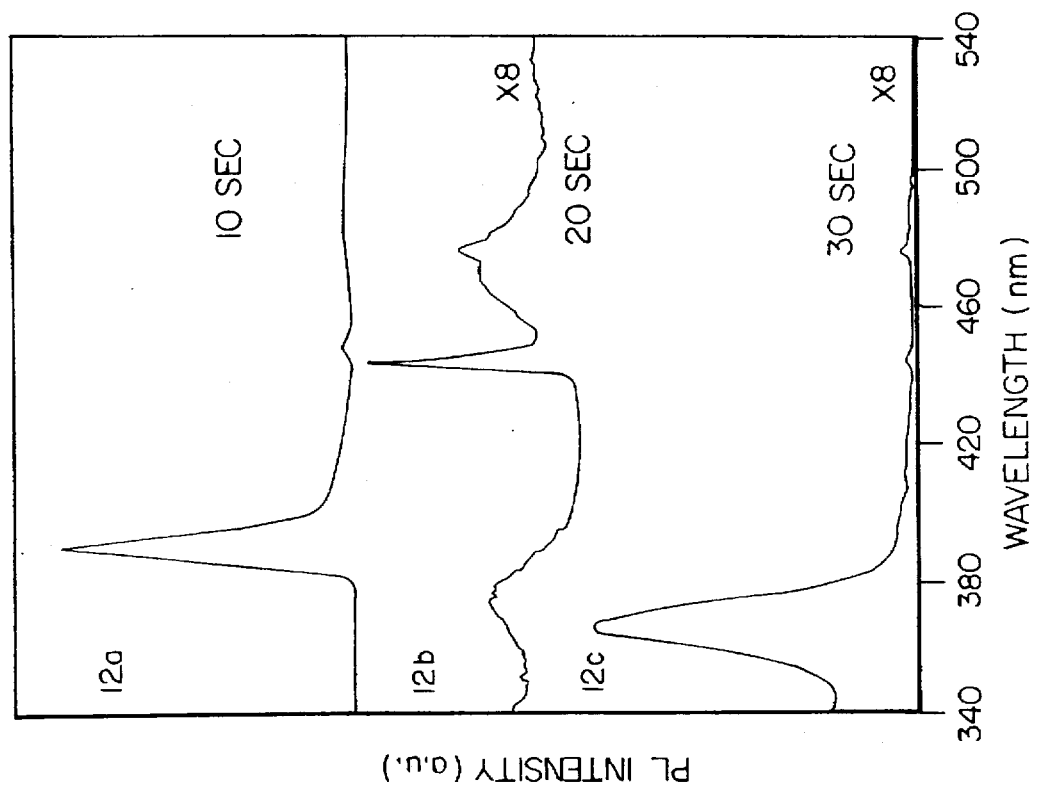
FIGS. 12a to 12c show photo-luminescence (PL) spectra for various strained layer superlattices.

FIGS. 12a–c shows PL spectra at 77K for a ZnSe—MgS strained layer superlattice with a ZnSe growth time of 15 sec and with an MgS growth time of 10 sec, 20 sec and 30 sec in FIGS. 12a to 12c, respectively. The peak energies of the emission due to quantized energy level where (a) 3.19 eV, (b) 3.31 eV and (c) 3.39 eV, respectively. The bandgap energy difference between all of the strained layer superlattices and ZnSe is more than 0.3 eV, which means that all of the strained layer superlattices are promising as a cladding or confinement barrier region.

In a second experiment, the ZnSe well thickness dependence of PL spectra of ZnAe—MgS strained layer superlattices was investigated. The strained layer superlattices were grown by molecular beam epitaxy with following growth conditions: GaAs substrate, substrate temperature of 275° C., beam equivalent pressures of Zn, Se, Mg and S are $8\times10^{-7}$, $1.8\times10^{-6}$, $1.0\times10^{-7}$ and $2\times10^{-7}$ Torr, respectively.

Figure 20:
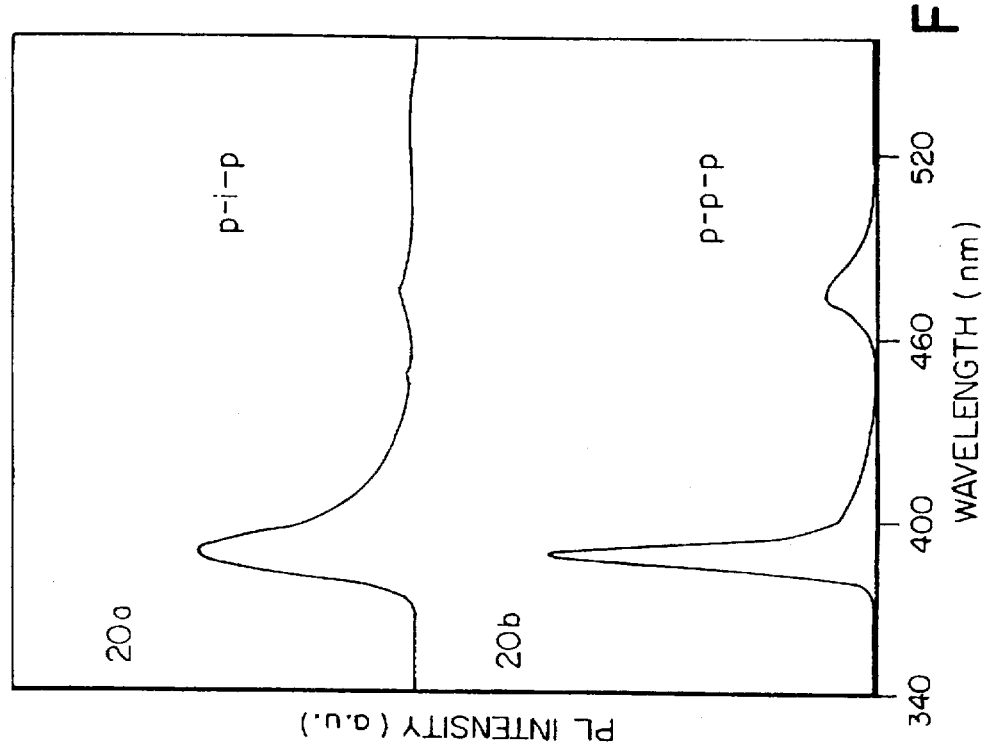
FIGS. 20a and 20b show PL spectra for the devices shown in FIGS. 18 and 19.

FIGS 13a and 13b show spectra at 77K for ZnSe—MgS strained layer superlattices with MgS growth time of 10 sec and with the parameter of ZnSe growth time of 10 seconds for FIG. 13a and 20 seconds for FIG. 13b. The peak energies of the emission due to quantized energy level were (a) 3.20 eV and (b) 2.98 eV, respectively. The bandgap energy difference between strained layer superlattices with thinner ZnSe well thickness (FIG. 9a) and ZnSe is more than 0.3 eV, which means the strained layer superlattices with the thinner ZnSe well thickness is a more promising material as a cladding or confinement barrier region.

In the next stage of investigation, Cl-doped strained layer superlattices were grown. The two different types of Cl-doped strained layer superlattices are shown in FIGS. 14 and 15.

The device shown in FIG. 14 has an n-type GaAs substrate 30 which has an n-type ZnSe buffer layer 32 formed thereon. An intrinsic ZnSe—MgS strained layer superlattice 34 is formed over the buffer layer 32 and an n-type ZnSe cap layer 36 (also a buffer layer) is formed over the strained layer superlattice 34. This forms a n-i-n (Cl doped ZnSe, non-doped super lattice, Cl doped ZnSe) structure. The strained layer superlattice 34 was grown by molecular beam epitaxy with a substrate temperature of 275° C. and a beam equivalent pressures for Zn, Se, Mg and S of $8\times10^{-7}$, $1.8\times10^{-6}$, $1.0\times10^{-7}$ and $2\times10^{-7}$ Torr respectively and with a K-cell temperature of $ZnCl_2$ of 147° C. An indium electrode 38 is formed in contact with the substrate 1 and a further indium electrode 40 having a radius of 200 µm is formed over the cap layer 36 by vacuum evaporation.

FIG. 15 shows a similar device to that illustrated in FIG. 14, but the intrinsic ZnSe—MgS strained layer superlattice 34 is replaced by an n-type ZnSe—MgS strained layer superlattice 42, thereby giving a n—n—n (cl doped ZnSe, Cl doped superlattice, Cl doped ZnSe) structure.

Figure 13:
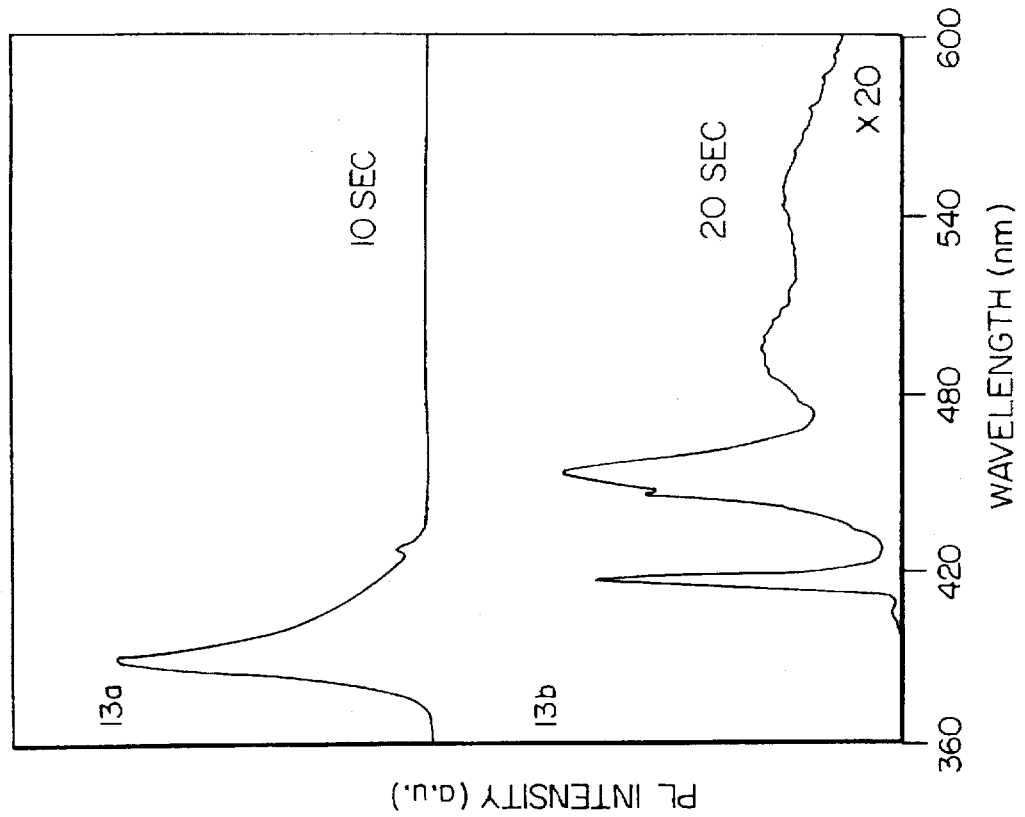
FIGS. 13a and 13b show PL spectra for further strained layer superlattices.

FIGS. 16a and 16b show the PL spectra for the devices illustrated in FIGS. 13 and 14, respectively. Both devices show a peak energy of 3.21 eV due to emission from a quantized energy level.

Figure 17:
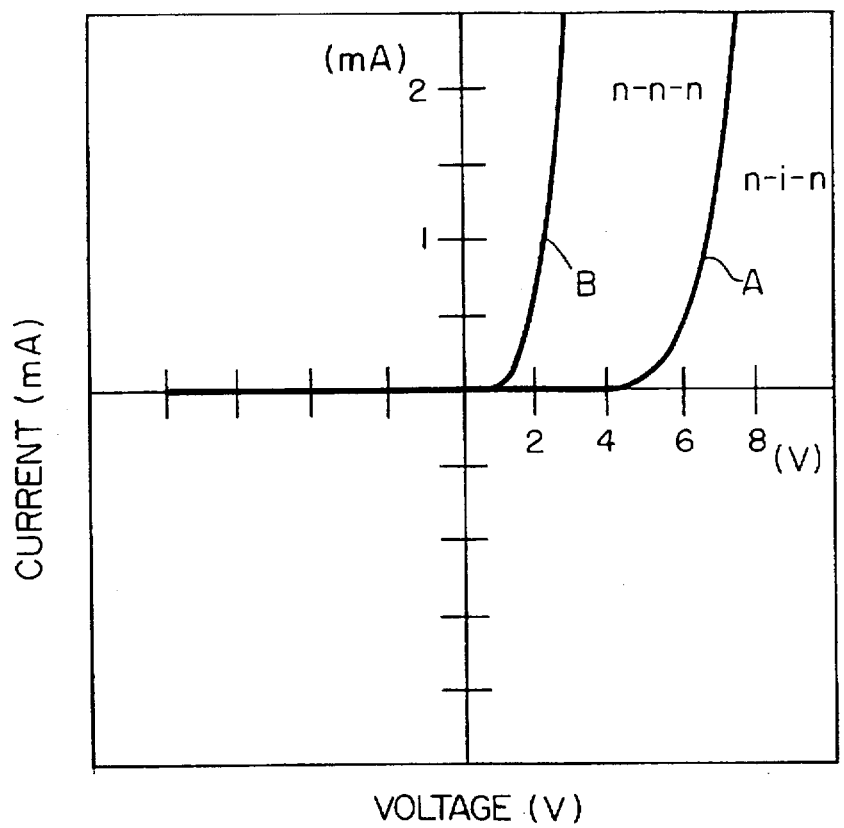
FIG. 17 is a graph of the I–V characteristics for the devices shown in FIGS. 14 and 15.

FIG. 17 shows the current-voltage characteristics for the devices illustrated in FIGS. 14 and 15. The line labelled A refers to the device shown in FIG. 14, whereas the line labelled B refers to the device shown in FIG. 15. As can be seen, the n—n—n structure of FIG. 15 exhibits better current flow than the intrinsic structure shown in FIG. 14. This implies that the CL-doping works effectively inside a strained layer superlattice.

Two further devices having nitrogen-doped strained layer superlattices were also fabricated. The device shown in FIG. 18 has a p-type GaAs substrate 50 upon which is formed a p-type ZnSe buffer layer 52. An intrinsic type ZnSe—MgS strained layer superlattice 34 is formed over the layer 52 and a p-type ZnSe cap layer 54 is formed over the layer 34.

The strained layer superlattice 34 was grown by molecular beam epitaxy with the following growth conditions: a GaAs substrate having a temperature of 275° C., beam equivalent pressures of Zn, Se, Mg and S of $8\times10^{-7}$, $1.8\times10^{-6}$, $1.0\times10^{-7}$ and $2\times10^{-7}$ Torr, respectively. This gives rise to a p-i-p (N-doped ZnSe, non-doped superlattice, N-doped ZnSe) structure. Nitrogen doping was performed by a radial doping technique with an input power of 250 W and a background pressure of $4.2\times10^{-7}$ Torr.

An indium electrode 38 is formed in contact with the substrate 50 and a 200 µm radius gold electrode 56 is formed over the cap layer 54.

Figures 18, 19:
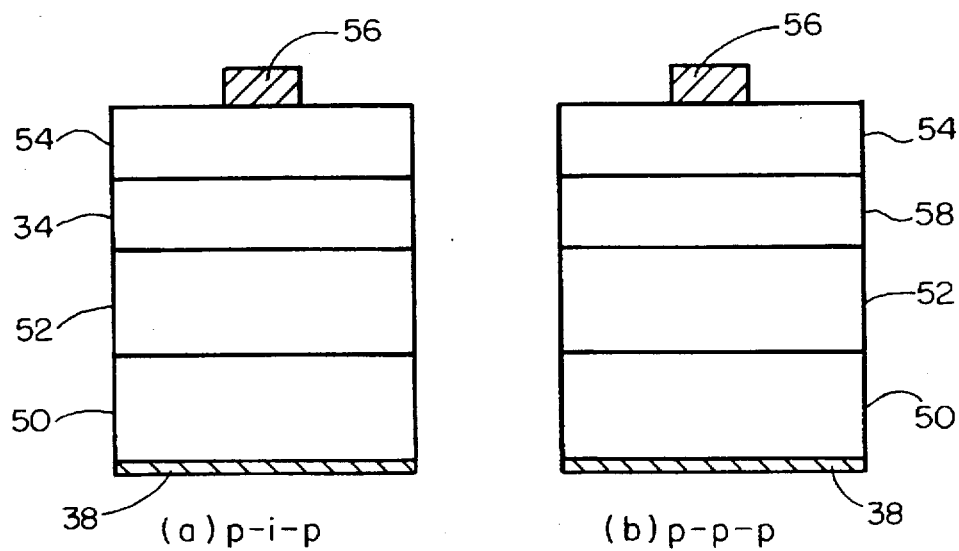
FIGS. 18 and 19 show further devices incorporating superlattices for investigation of the effect of such superlattices.

The device shown in FIG. 19 is similar to that shown in FIG. 18, except that the intrinsic type strained layer superlattice 34 is replaced by a p-type ZnSe—MgS strained layer superlattice 58, thereby giving rise to a p—p—p (N-doped ZnSe, N-doped superlattice, N-doped ZnSe) structure.

FIGS. 20a and 20b show the PL spectra at 77K for the devices shown in FIGS. 18 and 19, respectively. Both devices showed a peak energy level of 3.2 eV due to emission from a quantized energy level.

Figure 21:
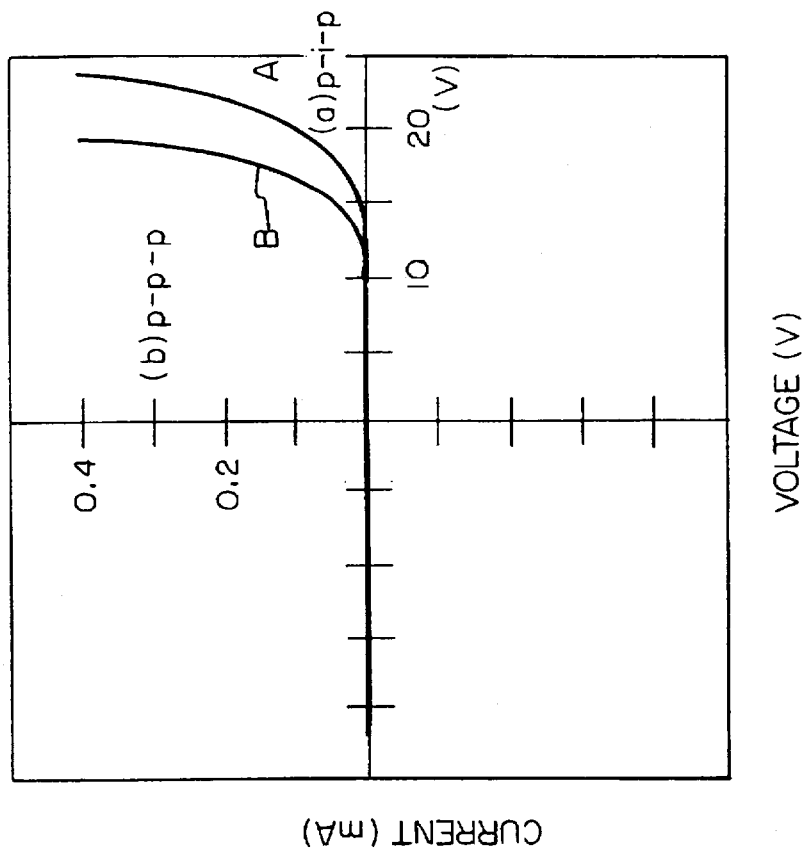
FIG. 21 is a graph of the I–V characteristics for the devices shown is FIGS. 18 and 19.

FIG. 21 shows the current versus voltage characteristics for the devices shown in FIGS. 18 and 19. The line labelled A relates to the device shown in FIG. 18, whereas the line B relates the device shown in FIG. 19. As can be seen, the device shown in FIG. 19 having a p-doped strained layer superlattice 58 has an improved current flow compared to the device shown in FIG. 18. This indicates that N-doping works effectively inside the strained layer superlattice.

The above results indicate that the ZnSe—MgS strained layer superlattice is a promising cladding or carrier barrier layer.

Referring now to FIG. 22, the laser comprises an n-type GaAs substrate 30 with an n-type ZnSe cladding layer 60 formed thereon. A $Zn_{0.8}Cd_{0.2}Se$ active layer 62 is positioned above the layer 60 and a p-type ZnSe cladding layer 64 is formed above the active layer 62. Finally, a p-type contact layer 66 is formed over the p-type cladding layer 64. An indium electrode 38 makes contact with the substrate 30, whereas a 5 µm wide gold electrode 68 is formed in contact with the p-type contact layer 66. The laser is cleaved from a wafer and has a cavity length of 1 mm. The laser is mounted on a copper heatsink in a junction-up configuration.

Referring now to FIG. 23, a second laser is substantially identical to the laser of FIG. 22 with the exception that a p-type ZnSe—MgS strained layer superlattice 58 if formed between the active layer 62 and the p-type ZnSe cladding layer 64. The superlattice 58 includes a miniband and defines a carrier confinement barrier for the active layer 62. The minimum energy level of the miniband is equal to the energy level of such barrier.

The current versus light output characteristic for the lasers of FIGS. 22 and 23 was measured at 77K in a pulsed mode having a pulse width of 2 ms and a 1/5000 duty cycle. The laser mirrors were as cleaved and the strained layer superlattice 58 in the second laser (FIG. 23) comprised 20 periods of four monolayer ZnSe with two monolayer MgS.

The current versus light intensity characteristic for the laser is illustrated in FIG. 24. The second laser (FIG. 23) with the strained layer superlattice showed a threshold current of 10 mA which was three times smaller than the equivalent laser without the strained layer superlattice. This demonstrates that the ZnSe—MgS strained layer superlattice is effective in suppressing electron overflow and encouraging better hole transport. The lasing wavelength was 490 nm.

Referring now to FIG. 25, a third laser comprises an n-type GaAs substrate 30 having an n-type ZnSe buffer layer 32 formed thereon. An n-type $ZnS_{0.07}Se_{0.93}$ cladding layer 70 is formed over the layer 32 and has an n-type ZnSe—MgS strained layer superlattice 42 formed thereon. A ZnSe active layer 72 is formed over the strained layer superlattice 42 and has a p-type ZnSe—MgS strained layer superlattice 58 formed thereon. Each of the superlattices 42 and 58 defines a carrier confinement barrier for the active layer 72 and each has a miniband whose minimum energy level is equal to the energy level of such barrier. A p-type $ZnS_{0.07}Se_{0.93}$ cladding layer 74 is formed over the strained layer superlattice 58 and finally a p-type contact layer 66 is formed over the cladding layer 74. An indium electrode 38 makes contact with the substrate 30 and a strip electrode 68 makes contact with the contact layer 66. The laser exhibited a lasing wavelength of less than 480 nm at room temperature which fell to less than 460 nm at 77K. These wavelengths cannot be obtained using a ZnMgSSe quaternary compound.

Referring now to FIG. 26, a fourth laser is similar to the laser shown in FIG. 25 except that the n-type ZnSe—MgS strained layer superlattice 42 fabricated between the n-type cladding layer 70 and the active layer 72 was omitted. Lasing was observed at 77K with a wavelength of 445 nm.

For the devices shown in FIGS. 25 and 26, the strained layer superlattice structures comprised 20 periods of 4 monolayers of ZnSe in conjunction with 2 monolayers of MgS.

A graded index separate confinement heterostructure (GRINSCH) laser was fabricated. The device structure is shown in FIG. 27 and is similar to that of the device shown in FIG. 25 except that the strained layer superlattices 42 and 58 at either side of the active region 72 are replaced by modulated period strained layer superlattices 76 and 78. The relative widths of the quantum well and quantum barrier in the modulated period strained layer superlattices are varied towards the active layers so as to provide a graded energy band profile, as schematically illustrated in FIG. 28. Each superlattice 42 and 58 defines the carrier confinement barrier for the active region 72 and includes a miniband (not depicted in FIG. 28) whose minimum energy level is equal to the energy level of such barrier. In an alternative arrangement, the superlattice is in the flat band cladding region of the GRINSCH structure and the miniband of such superlattice has a minimum energy level which is equal to or greater than the minimum energy level of the graded region of the GRINSCH structure.

Figure 29:
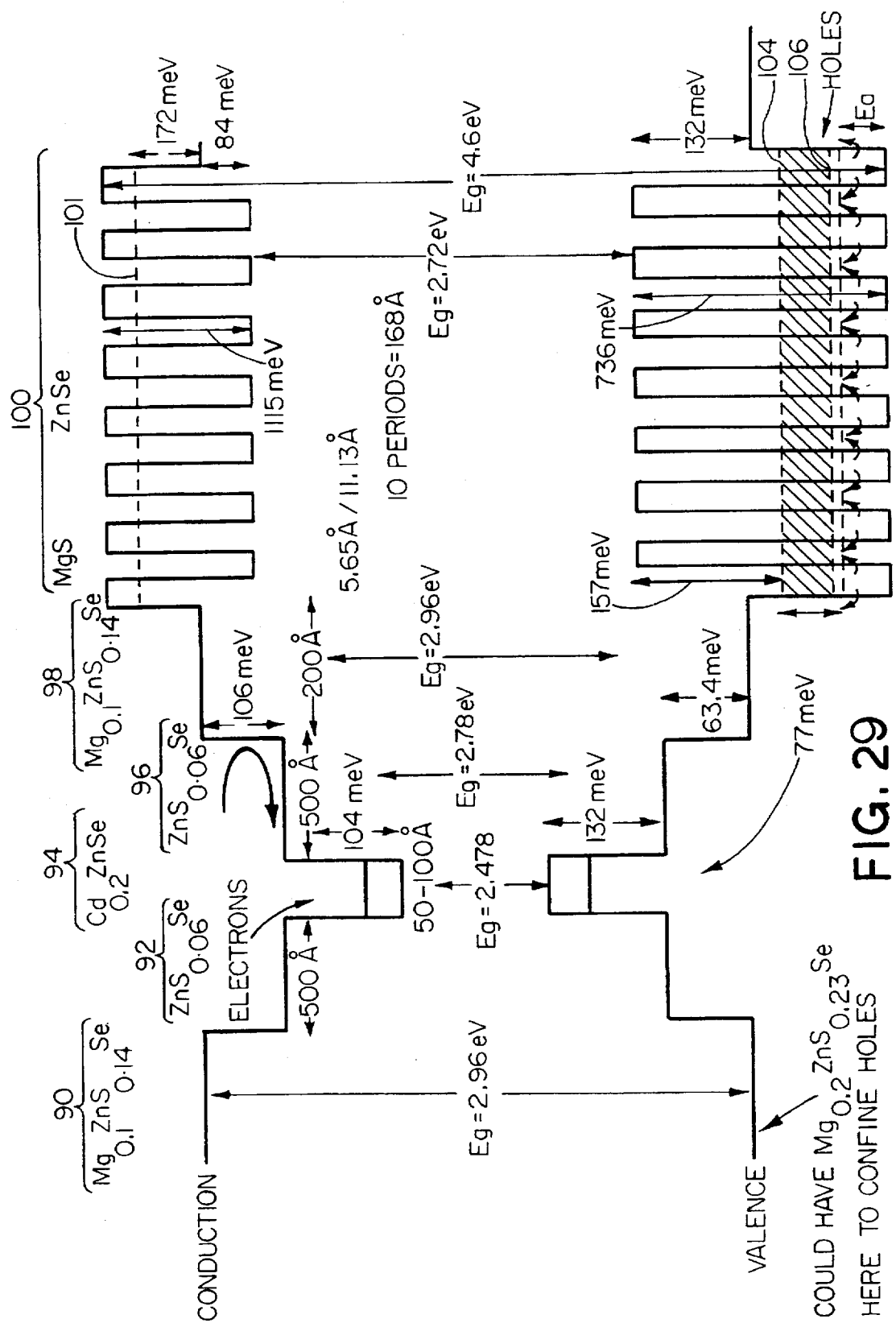
FIG. 29 is a diagram of an energy level scheme of a laser constituting a further embodiment of the present invention.

FIG. 29 illustrates an energy level scheme for a laser having an $Mg_{0.1}ZnS_{0.14}Se$ cladding layer 90 formed over a substrate (not shown). A 500 Å thick $ZnS_{0.06}Se$ guiding layer 92 is formed over the layer 90 and supports an $Cd_{0.2}ZnSe$ active layer 94 between 50 and 100 Å thick. A further guiding layer 96 identical to the guiding layer 92 covers the active layer 94. A 200 Å thick $Mg_{0.01}ZnS_{0.14}Se$ cladding layer 98 provides an optical confining region between the guiding layer 96 and a superlattice 100. The cladding layer 98 and the superlattice 100 together define a cladding region. Such cladding region and the guiding layer 96 act as confinement barriers for the carriers contained in the active layer 94. The superlattice 100 consists of 10 repetitions of a 5.65 Å thick layer of MgS and a 11.13 Å thick layer of ZnSe. FIG. 29 illustrates the relative energy levels of electrons in the conduction band and holes in the valence band of such a device. FIG. 29 also indicates the depth of the quantum wells formed in the superlattice 100 as seen by electrons and holes. The chain lines 104 and 106 schematically illustrate the boundaries of miniband 107 and the lines 108 illustrate the acceptor energy levels of the dopant within the barrier material.

In use, electrons and holes recombine within a quantum well formed by active layer 94. The guiding layers 92 and 96 form barrier regions for the active region 94, and the layers 92 and 96 form an optical guiding region within the device. Optical radiation, and electrons and holes, are confined by the cladding layers 90 and 98 and the superlattice 100. Electrons are injected into the cladding layer 90 and move towards the active layer 94. Electrons which pass beyond the active layer 94 are reflected by the superlattice 100 which forms an effective barrier of 172 meV as indicated by the chain line 101. The holes are injected into the heavy hole miniband 107. The holes then travel towards the active layer 94. The transport of holes within the miniband 107 is improved by doping at least the quantum barriers within the superlattice 100. Ea represents the activation energy of the acceptors that have been implanted into the quantum barriers by doping. Thus the superlattice 100 acts to confine electrons as well as to improve hole transport.

Figure 30:
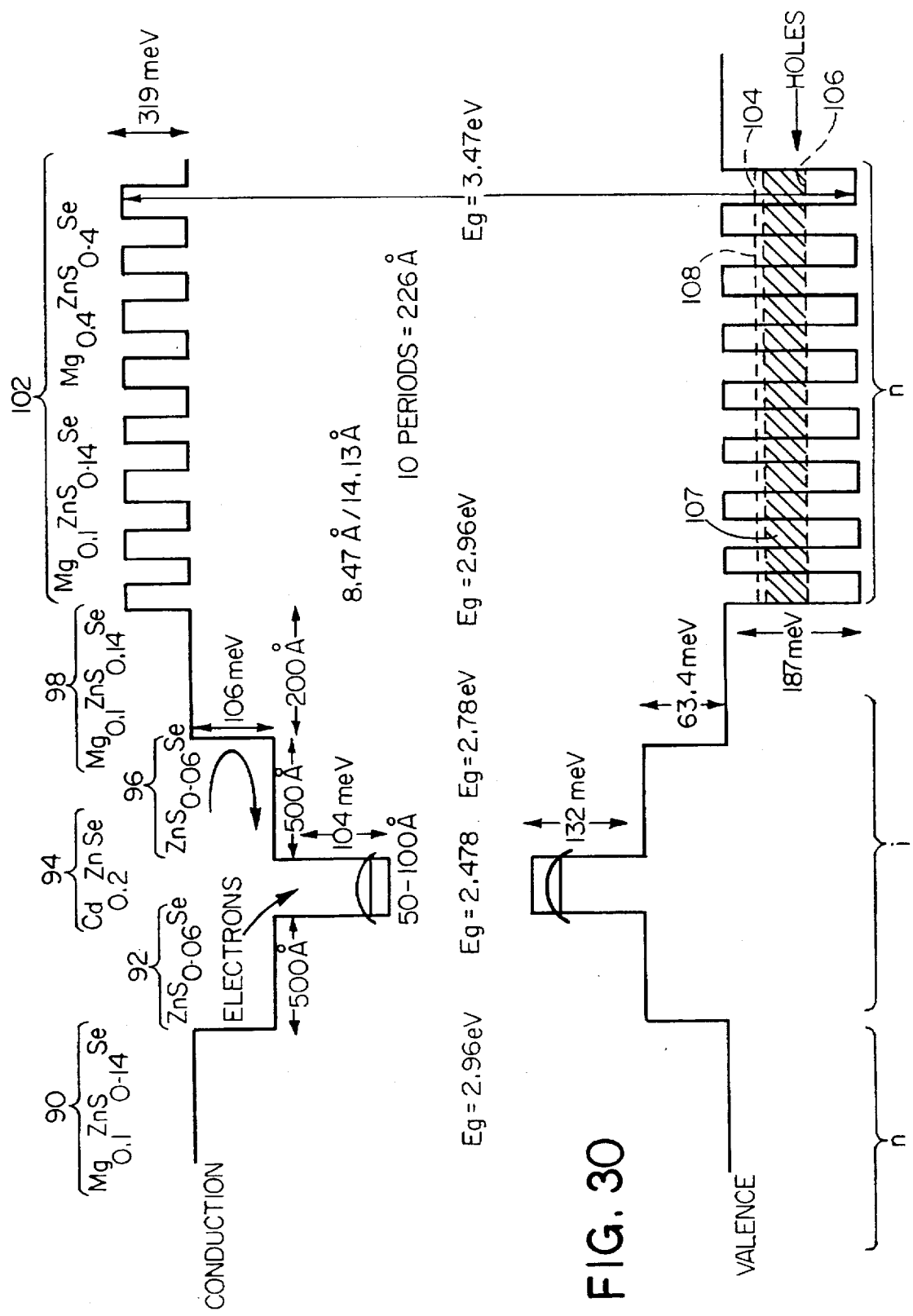
FIG. 30 is an energy level diagram for a laser constituting another embodiment of the present invention.

FIG. 30 shows the energy level scheme for a laser which is similar to the device described with reference to FIG. 29, except that the superlattice 100 has been replaced by a p-doped superlattice 102 having 10 repetitions of a $Mg_{0.1}ZnS_{0.14}Se$ layer 8.47 Å thick and a $Mg_{0.4}ZnS_{0.4}Se$ layer 14.31 Å thick. This gives less of a bandgap in the superlattice compared to the device shown in FIG. 29. The operation of the device shown in FIG. 30 is similar to that shown in FIG. 29.

Figure 31:
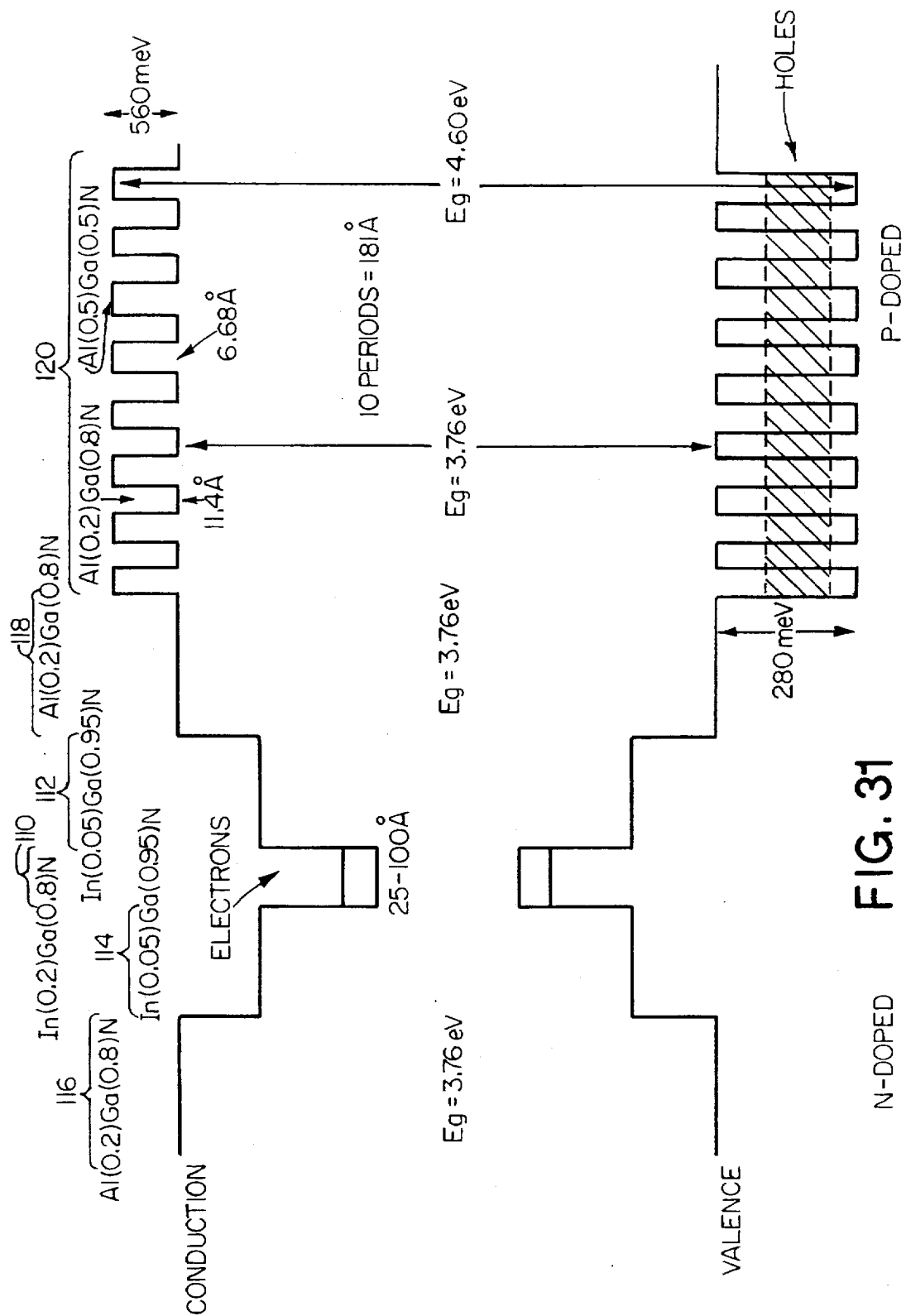
FIG. 31 shows the energy level scheme for a laser which is similar in structure to the devices described with reference to FIGS. 29 and 30.

FIG. 31 shows the energy level scheme for a laser which is similar in structure to the devices described with reference to FIGS. 29 and 30, except that the active layer 94 has been replaced by a quantum well 110 or a multi-quantum well structure composed of $In_{0.2}Ga_{0.95}N$, the guiding regions 112, 114 are composed of $In_{0.05}Ga_{0.95}N$, and the cladding layers 116, 118 are composed of $Al_{0.2}Ga_{0.8}N$. The superlattice 100 has been replaced by a p-doped superlattice 120 having 10 repetitions of an $Al_{0.2}Ga_{0.8}N$ layer 11.4 Å thick and an $Al_{0.05}Ga_{0.5}N$ layer 6.68 Å thick. The operation of the device shown in FIG. 31 is similar to that of the device shown in FIG. 29.

Figure 32:
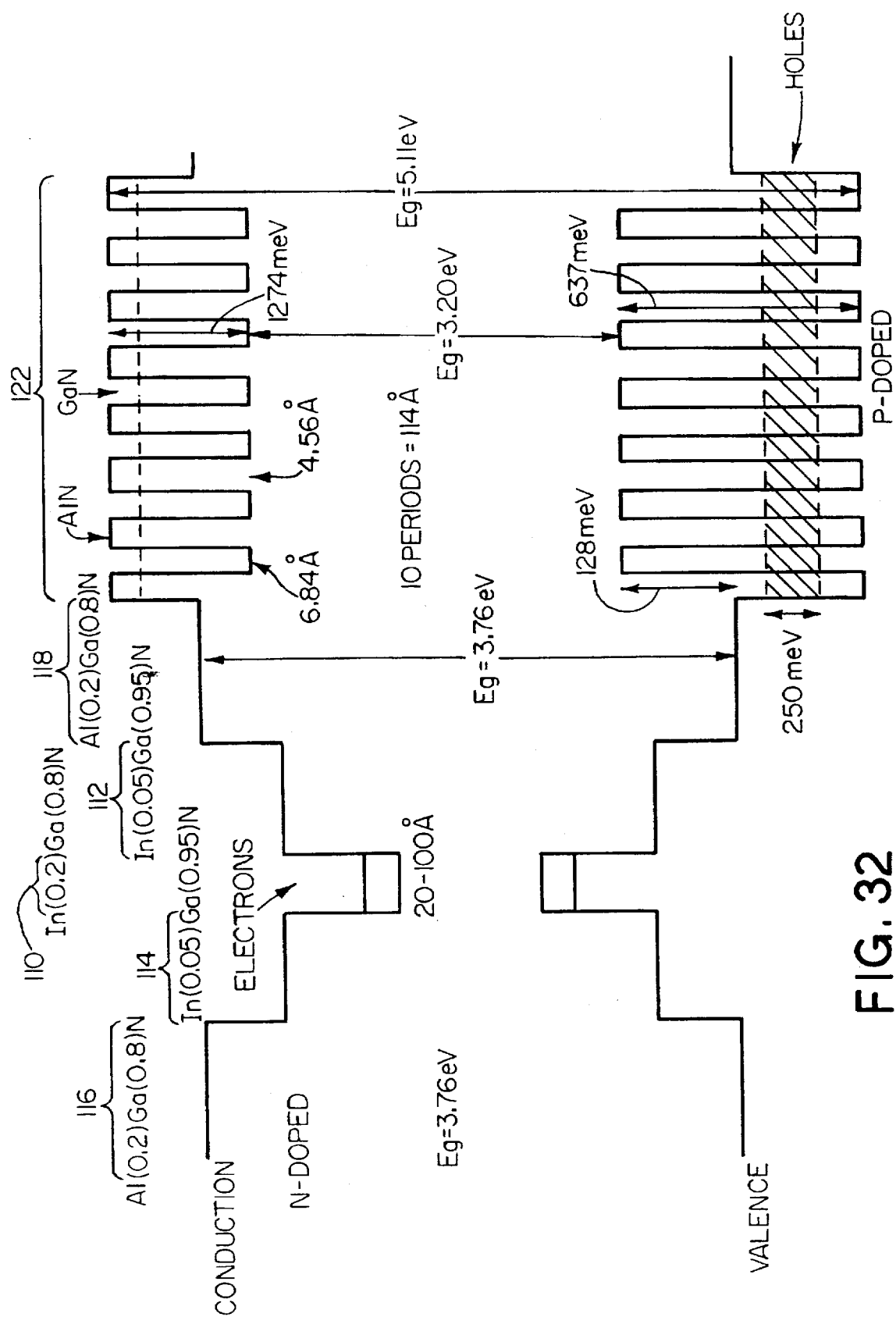
FIG. 32 shows the energy level scheme for a laser which is similar in structure to the device described with reference to FIG. 31.

FIG. 32 shows the energy level scheme for a laser which is similar in structure to the device described with reference to FIG. 31, except that the superlattice 120 has been replaced by a p-doped superlattice 122 having 10 repetitions of GaN layer 6.84 Å thick and a AlN layer 4.56 Å thick. Any strain within this superlattice can be balanced through the design of the superlattice. The operation of the device shown in FIG. 32 is similar to that shown in FIG. 29.

In any of the above-described embodiments of the present invention, the active layer/region may be a single quantum structure, or it may be a multi-quantum well structure, in which latter case the minimum energy level of the miniband is greater than or equal to the energy level of the barriers of the multi-quantum well structure.

The formation of a miniband is not restricted to devices formed solely of II-VI semiconductors. Devices constituting embodiments of the present invention can also be formed from II-V semiconductor systems such as (AlGaIn)P and (AlGaIn)N alloys.

It is thus possible to provide blue light laser diodes capable of continuous operation at room temperature.

What is claimed is:

1. An optoelectronic semiconductor device for emitting light including an active region, a first superlattice region and a guiding region disposed between the active region and the first superlattice region, the first superlattice region having a repeating pattern of first and second semiconductor regions which define a plurality of quantum wells separated from each other by quantum barriers, the pattern repeat period being sufficiently small so as to form a miniband within the first superlattice region, wherein the carriers are transported through the miniband and light is emitted due to interband recombination of injected electrons and holes.

2. An optoelectronic semiconductor device including an active region, a first superlattice region and a guiding region disposed between the active region and the first superlattice region, the first superlattice region having a repeating pattern of first and second semiconductor regions which define a plurality of quantum wells separated from each other by quantum barriers, the pattern repeat period being sufficiently small so as to form a miniband within the first superlattice region, wherein the minimum energy level of the miniband is greater than or equal to the energy level of the guiding region.

3. An optoelectronic semiconductor device including an active region and an adjacent first superlattice region, the first superlattice region having a repeating pattern of first and second semiconductor regions which define a plurality of quantum wells separated from each other by quantum barriers, the pattern repeat period being sufficiently small so as to form a miniband within the first superlattice region, wherein the first superlattice region defines a carrier confinement barrier for the active region, and wherein the minimum energy level of the miniband is equal to the energy of the carrier confinement barrier.

4. An optoelectronic semiconductor device including an active region comprising a first plurality of quantum wells separated from each other by first quantum barriers, and a first superlattice region, the first superlattice region having a repeating pattern and second semiconductor regions which define a second plurality of quantum wells separated from each other by second quantum barriers, the pattern repeat period being sufficiently small so as to form a miniband within the first superlattice region, wherein the minimum energy level of the miniband is greater than or equal to the level of the first quantum barriers.

5. An optoelectronic semiconductor device as claimed in claim 1, further comprising a carrier injection region for injecting carriers into the miniband, the energy level of the injection region being substantially matched with that of the miniband.

6. An optoelectronic semiconductor device as claimed in claim 1, wherein the active region has an energy bandgap corresponding to the energy bandgap between the conduction and valence bonds of the material forming the active region.

7. An optoelectronic semiconductor device as claimed in claim 1, in which the first and second semiconductors are II-VI group semiconductors.

8. An optoelectronic semiconductor device as claimed in claim 7, in which the first and second semiconductors consist of combinations of pseudomorphic quaternary alloys.

9. An optoelectronic semiconductor device as claimed in claim 7, in which the first semiconductor comprises $ZnS_xSe_{1-x}$ where x is greater than zero and less than one, and the second semiconductor comprises $MgS_ySe_{1-y}$ where y is greater than zero and less than one.

10. An optoelectronic semiconductor device as claimed in claim 7, in which the first semiconductor is ZnSe and the second semiconductor is MgS.

11. An optoelectronic semiconductor device as claimed in claim 1, in which the first and second semiconductors are III-V group semiconductors.

12. An optoelectronic semiconductor device as claimed in claim 11, in which the first and second semiconductors consist of combinations of pseudomorphic quaternary alloys.

13. An optoelectronic semiconductor device as claimed in claim 11, in which the first and second semiconductors are combinations of the alloy system (AlGaIn)N.

14. An optoelectronic semiconductor device as claimed in claim 11, in which the first and second semiconductors are combinations of the alloy system (AlGaIn)P.

15. An optoelectronic semiconductor device as claimed in claim 1, in which at least one of the first and second semiconductors are n-type doped.

16. An optoelectronic semiconductor device as claimed in claim 11, in which the first and second semiconductors are combinations of the alloy system (AlGa)N.

17. An optoelectronic semiconductor device as claimed in claim 11, in which the first semiconductor is AlN and second semiconductor is GaN.

18. An optoelectronic semiconductor device as claimed in claim 15, in which the dopant is Cl.

19. An optoelectronic semiconductor device as claimed in claim 1, in which at least one of the first and second semiconductors are p-type doped.

20. An optoelectronic semiconductor device as claimed in claim 19, in which the dopant is nitrogen.

21. An optoelectronic semiconductor device as claimed in claim 1, in which the first and second semiconductors are lattice mis-matched with respect to a substrate but combined such that they experience substantially no net strain.

22. An optoelectronic semiconductor device as claimed in claim 1, in which the first and second semiconductors are lattice matched to the substrate.

23. An optoelectronic semiconductor device as claimed in claim 21, in which the substrate is GaAs.

24. An optoelectronic semiconductor device as claimed in claim 22, in which the substrate is GaAs.

25. An optoelectronic semiconductor device as claimed in claim 21, in which the substrate is ZnSe.

26. An optoelectronic semiconductor device as claimed in claim 22, in which the substrate is ZnSe.

27. An optoelectronic semiconductor device as claimed in claim 8, in which the pattern repeat period is six monolayers or less.

28. An optoelectronic semiconductor device as claimed in claim 1, in which the relative thickness of the first and second semiconductor regions and/or the pattern repeat period vary as a function of position.

29. An optoelectronic semiconductor device as claimed in claim 1, in which the device further comprises a second superlattice region having a repeating pattern of third and fourth semiconductor regions, the pattern repeat being sufficiently small so as to form a miniband within the second region, and in which the active layer is sandwiched between the first and second superlattice regions.

30. An optoelectronic semiconductor device as claimed in claim 29, in which the relative thickness of the third and fourth semiconductor regions and/or pattern repeat period vary as a function of position.

31. An optoelectronic semiconductor device as claimed in claim 8, in which the first semiconductor regions are substantially twice the thickness of the second semiconductor regions.

32. A laser comprising the optoelectronic semiconductor device as claimed in claim 1.

33. A modulator comprising the optoelectronic semiconductor device as claimed in claim 1.

* * * * *